United States Patent
Driscoll et al.

(10) Patent No.: US 9,403,590 B2
(45) Date of Patent: Aug. 2, 2016

(54) ELECTRO-OPTIC WINDOW ASSEMBLY EMI SHIELD

(71) Applicant: Gentex Corporation, Zeeland, MI (US)

(72) Inventors: David I. Driscoll, Caledonia, MI (US); Bradley L. Busscher, Grand Rapids, MI (US); Kevin L. Ash, Grand Rapids, MI (US); Andrew J. LeVesque, Holland, MI (US); James E. Teune, Zeeland, MI (US); Christian M. Kemperman, Grand Haven, MI (US); David A. Theiste, Byron Center, MI (US); Andrew T. Mitchell, Hudsonville, MI (US)

(73) Assignee: GENTEX CORPORATION, Zeeland, MI (US)

(*) Notice: Subject to any disclaimer, the term of this patent is extended or adjusted under 35 U.S.C. 154(b) by 2 days.

(21) Appl. No.: 14/338,070

(22) Filed: Jul. 22, 2014

(65) Prior Publication Data

US 2015/0029574 A1     Jan. 29, 2015

Related U.S. Application Data

(60) Provisional application No. 61/858,849, filed on Jul. 26, 2013.

(51) Int. Cl.
*G02F 1/153* (2006.01)
*G02F 1/15* (2006.01)
(Continued)

(52) U.S. Cl.
CPC ............... *B64C 1/1492* (2013.01); *B60R 1/088* (2013.01); *B64C 1/1484* (2013.01); *G02F 1/153* (2013.01);
(Continued)

(58) Field of Classification Search
CPC ...... B64C 1/14; B64C 1/1484; B64C 1/1492; G02F 1/15; G02F 1/153; G02F 1/1533; G02B 27/00; B60R 1/088; B60Q 1/2665; H05K 9/0005
USPC ............ 359/265, 267, 275, 871, 872; 348/77, 348/78, 148; 362/494; 29/428
See application file for complete search history.

(56) References Cited

U.S. PATENT DOCUMENTS

| 4,893,908 A | 1/1990 | Wolf et al. |
| 5,007,217 A | 4/1991 | Glover et al. |

(Continued)

FOREIGN PATENT DOCUMENTS

WO    WO03/011688    2/2003

OTHER PUBLICATIONS

Patent Cooperation Treaty, International Searching Authority, International Search Report, Written Opinion of the International Searching Authority and Notification of Transmittal, Nov. 13, 2014, 8 Pages.
(Continued)

*Primary Examiner* — Loha Ben
(74) *Attorney, Agent, or Firm* — Price Heneveld LLP; Scott P. Ryan

(57) ABSTRACT

An aircraft window foam mounting assembly having an exterior pressure pane frame including an inner surface and an outer surface. A pressure pane is in abutting contact with the inner surface of the exterior pressure pane frame. A foam bezel is proximate a periphery of the pressure pane and defines an inner opening. The foam bezel includes an inner wall and an outer wall. The inner wall includes a channel. An electrochromic element is disposed in the opening and is configured for reception in the channel of the inner wall. An electrically conductive member is operably coupled to the foam bezel and extends from the inner wall to the outer wall.

20 Claims, 4 Drawing Sheets

(51) Int. Cl.
*B64C 1/14* (2006.01)
*B60R 1/08* (2006.01)
*H05K 9/00* (2006.01)

(52) U.S. Cl.
CPC ............... *G02F 1/1533* (2013.01); *B64C 1/14* (2013.01); *G02F 1/15* (2013.01); *H05K 9/0005* (2013.01); *Y10T 29/49826* (2015.01)

(56) References Cited

U.S. PATENT DOCUMENTS

| | | | |
|---|---|---|---|
| 5,042,923 A * | 8/1991 | Wolf | G02F 1/1533 359/275 |
| 5,384,653 A | 1/1995 | Benson et al. | |
| 5,983,593 A | 11/1999 | Carbary et al. | |
| 6,471,362 B1 * | 10/2002 | Carter | B60R 1/12 359/838 |
| 6,897,936 B1 | 5/2005 | Li et al. | |
| 7,064,882 B2 * | 6/2006 | Tonar | B32B 17/06 359/265 |
| 7,130,101 B2 | 10/2006 | Rukavina et al. | |
| 7,167,294 B2 | 1/2007 | Lynam et al. | |
| 7,324,261 B2 * | 1/2008 | Tonar | C09K 9/02 359/265 |
| 7,535,614 B1 | 5/2009 | Tapley et al. | |
| 7,990,603 B2 | 8/2011 | Ash et al. | |
| 8,105,645 B2 | 1/2012 | Bruce et al. | |
| 8,154,788 B2 | 4/2012 | Millett et al. | |
| 8,201,800 B2 | 6/2012 | Filipiak | |
| 8,210,695 B2 | 7/2012 | Roth et al. | |
| 8,313,817 B2 | 11/2012 | Bruce et al. | |
| 8,827,517 B2 * | 9/2014 | Cammenga | B60R 1/088 359/841 |
| 2008/0049295 A1 | 2/2008 | Tonar et al. | |
| 2012/0217346 A1 | 8/2012 | Eberle et al. | |
| 2012/0218655 A1 | 8/2012 | Steel et al. | |
| 2012/0268961 A1 | 10/2012 | Cammenga et al. | |
| 2012/0273738 A1 | 11/2012 | Sybert et al. | |
| 2012/0327234 A1 | 12/2012 | Fish, Jr. et al. | |
| 2013/0055951 A1 | 3/2013 | Bruce et al. | |
| 2013/0062497 A1 | 3/2013 | Vanhuis et al. | |
| 2013/0157493 A1 | 6/2013 | Brown | |
| 2013/0161971 A1 | 6/2013 | Bugno et al. | |
| 2014/0063630 A1 | 3/2014 | Busscher et al. | |
| 2014/0091123 A1 | 4/2014 | Kim et al. | |
| 2014/0097320 A1 | 4/2014 | Rizk et al. | |

OTHER PUBLICATIONS

Dr. John Straube, P.Eng., University of Waterloo, The Future of Window Technology . . . Is Here! Journal of Building Enclosure Design, http://www.buildingscience.com/documents/published-articles/pa-future-window-technology, 2010, 3 pages.

Citizens League for Environmental Action Now, Clean Living, http://www.cleanhouston.org/living/green_building/construction/windows.htm, 2004.

* cited by examiner

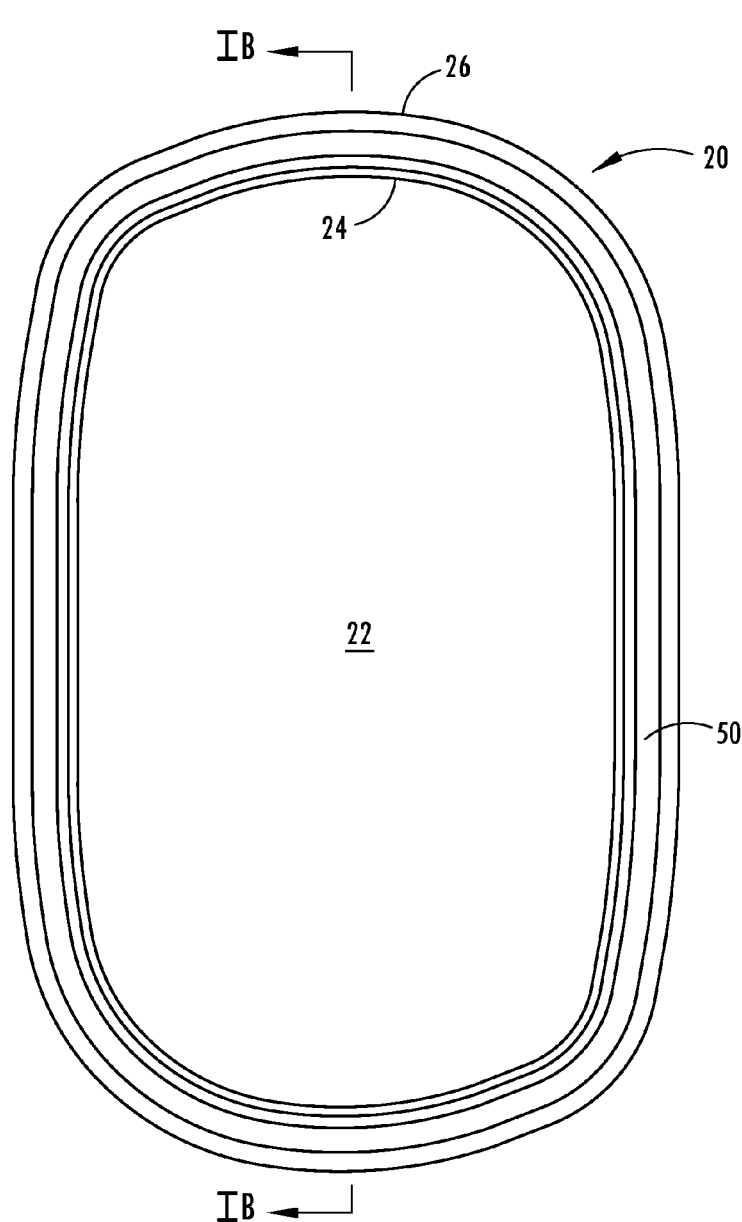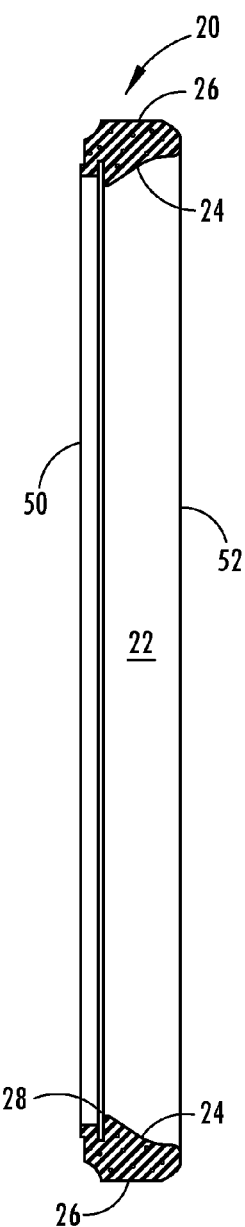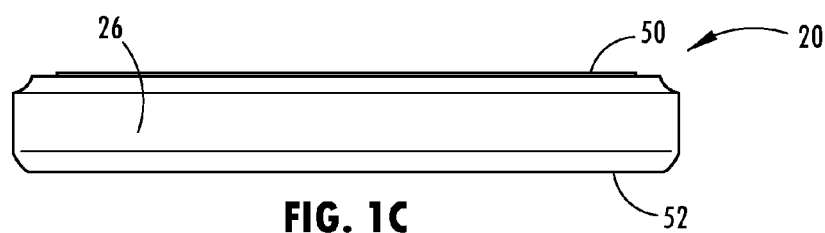
FIG. 1A
FIG. 1B
FIG. 1C

ELECTRO-OPTIC WINDOW ASSEMBLY EMI SHIELD

CROSS-REFERENCE TO RELATED APPLICATION

This application claims priority to and the benefit under 35 U.S.C. §119(e) of U.S. Provisional Patent Application No. 61/858,849, filed on Jul. 26, 2013, entitled "ELECTRO-OPTIC WINDOW ASSEMBLY EMI SHIELD," the entire disclosure of which is hereby incorporated herein by reference.

BACKGROUND OF THE INVENTION

The present invention generally relates to an aircraft window foam mounting assembly, and more specifically, to an aircraft window foam mounting assembly that includes an electrochromic element and electromagnetic shielding.

SUMMARY OF THE PRESENT INVENTION

One aspect of the present invention includes an aircraft window foam mounting assembly having an exterior pressure pane frame including an inner surface and an outer surface. A pressure pane is in abutting contact with the inner surface of the exterior pressure pane frame. A foam bezel is proximate a periphery of the pressure pane and defines an inner opening. The foam bezel includes an inner wall and an outer wall. The inner wall includes a channel. An electrochromic element is disposed in the opening and is configured for reception in the channel of the inner wall. An electrically conductive member is operably coupled to the foam bezel and extends from the inner wall to the outer wall.

Another aspect of the present invention includes a window mounting assembly having a bezel that defines an inner opening and includes an inner wall and an outer wall. The inner wall includes a channel. An electrochromic element is disposed in the opening and is configured for reception in the channel of the inner wall. An electrically conductive member is operably coupled to the bezel and extends from the inner wall to the outer wall.

Yet another aspect of the present invention includes a method for making an aircraft window foam mounting assembly. An exterior pressure pane frame is formed that includes an inner surface and an outer surface. A pressure pane abuts with the inner surface of the exterior pressure pane frame. A foam bezel is positioned proximate a periphery of the pressure pane. The foam bezel defines an inner opening and includes an inner wall and an outer wall. The inner wall includes a channel. An electrochromic element is inserted into the channel of the inner wall. An electrically conductive member is coupled to the foam bezel that extends from the inner wall to the outer wall.

Yet still another aspect of the present invention includes an aircraft window foam mounting assembly having an exterior pressure pane frame that includes an inner surface and an outer surface. A pressure pane is in abutting contact with the inner surface of the exterior pressure pane frame. A bezel is proximate a periphery of the pressure pane and defines an inner opening. The bezel includes an inner wall and an outer wall. The inner wall includes a channel. An electrochromic element is disposed in the opening and is configured for reception in the channel of the inner wall. A light limiting insert is operably coupled to the bezel and extends from the inner wall to the outer wall. The light limiting insert substantially decreases light infiltration through the bezel.

These and other aspects, objects, and features of the present invention will be understood and appreciated by those skilled in the art upon studying the following specification, claims, and appended drawings. It will also be understood that features of each embodiment disclosed herein may be used in conjunction with, or as a replacement for, features of the other embodiments.

BRIEF DESCRIPTION OF THE DRAWINGS

In the drawings:

FIG. 1A is a front elevational view of one embodiment of an aircraft window foam mounting assembly of the present invention;

FIG. 1B is a side cross-sectional elevational view of the aircraft window foam mounting assembly of FIG. 1A taken at line 1B;

FIG. 1C is a bottom plan view of the aircraft window foam mounting assembly of FIG. 1A;

DETAILED DESCRIPTION OF EMBODIMENTS

Figure 2:
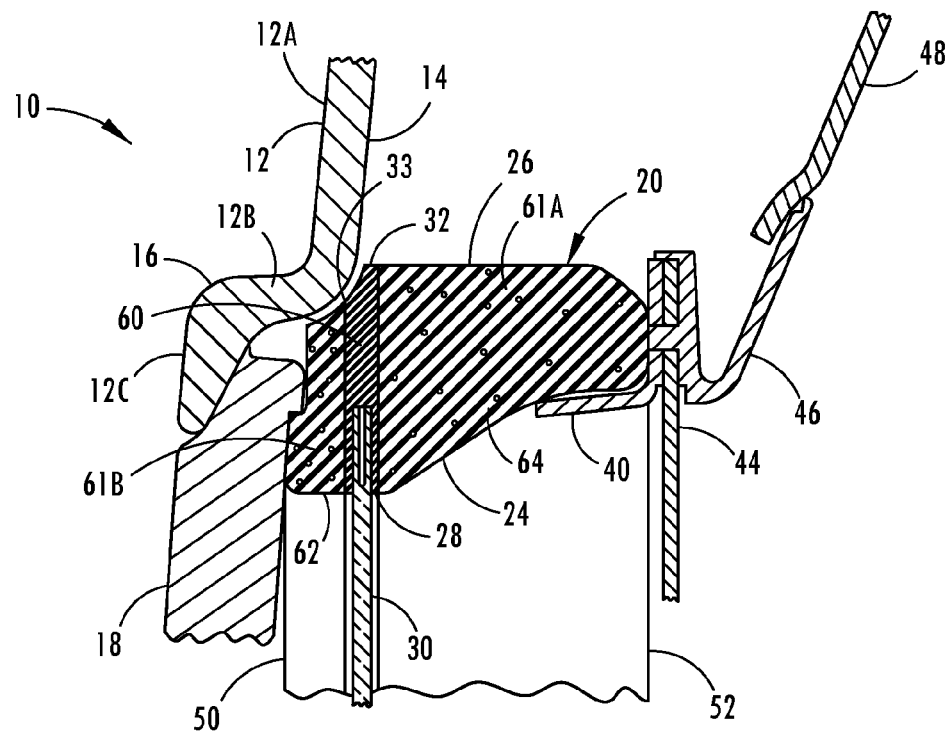
FIG. 2 is an enlarged top cross-sectional view of one embodiment of an aircraft window foam mounting assembly of the present invention.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to FIGS. 1A-6, reference numeral 10 generally designates a dimmable window mounting assembly for an aircraft including an exterior pressure pane frame 12 having an inner surface 14 and an outer surface 16. A pressure pane 18 is in abutting contact with the inner surface 14 of the exterior pressure pane frame 12. A foam bezel 20 is proximate a periphery of the pressure pane 18 and defines an inner opening 22. The foam bezel 20 includes an inner wall 24 and an outer wall 26. The inner wall 24 includes a channel 28. An electrochromic element 30 is disposed in the inner opening 22 and is configured for reception in the channel 28 of the inner wall 24. An electrically conductive member in the form of an insert 32 is operably coupled to the foam bezel 20 and extends from the inner wall 24 to the outer wall 26.

As illustrated in the embodiment of FIG. 2, the exterior pressure pane frame 12 includes an upper vertical portion 12A, a transition portion 12B, and a lower vertical portion 12C that is offset from the upper vertical portion 12A. The lower vertical portion 12C is configured to abut and retain the pressure pane 18. The foam bezel 20 is disposed inside the pressure pane 18, and in the illustrated embodiment, is abutting the pressure pane 18. Notably, a space may be disposed between the foam bezel 20 and the pressure pane 18. Also, a notch 33 is illustrated in the foam bezel 20 and is designed to accommodate the transition portion 12B of the exterior pressure pane frame 12.

With reference again to FIGS. 1A-1C and FIG. 2, the foam bezel 20 is generally configured to nest between an outer reveal 40 and the pressure pane frame 12. The foam bezel 20, or foam mount, is also proximate the pressure pane 18, and in the illustrated embodiment, is in abutting contact with the pressure pane 18. The pressure pane 18 generally defines a window through which passengers in an aircraft can view outside the aircraft. The channel 28 includes a depth and width configured to receive the electrochromic element 30 therein. The electrochromic element 30 is generally disposed between the pressure pane 18 and a dust cover 44. The dust cover 44 is held in place by an inner reveal 46, which is subsequently held in place by an interior sidewall 48. The interior sidewall 48 may include an interior trim to provide an aesthetically pleasing appearance inside an aircraft fuselage.

Referring again to FIGS. 1 and 2, it is contemplated that the foam bezel 20 may take on a variety of shapes, materials, and architectures that will generally define a frame-like structure. Regardless of the construction, the dimmable window mounting assembly 10 will include the inner wall 24 and the channel 28, as well as the outer wall 26. The foam bezel 20 also includes an exterior wall 50 configured to abut one or both of the pressure pane 18 and the pressure pane frame 12. The foam bezel 20 also includes an interior wall 52 configured to abut or nearly abut the outer reveal 40. The interior wall 52 includes a shorter height than the height of the exterior wall 50. Further, the interior wall 52 is generally angled upwardly from the exterior wall 50 to the interior wall 52. The foam bezel 20 cross section can differ from the illustrated embodiment. However, it will be understood that the foam bezel 20 secures the electrochromic element 30 in place and may be attached to or formed in the foam bezel 20.

In the illustrated embodiment, the outer reveal 40 is operably coupled with the inner reveal 46 through the dust cover 44. The outer reveal 40 includes a generally L-shaped cross-section and can come in a variety of lengths. In addition, a lower transverse leg of the outer reveal 40 supports a portion of the foam bezel 20. An upper vertical leg couples with the inner reveal 46. The inner reveal 46 includes a V-shaped configuration with an inner leg abutting the dust cover 44 and an outer leg abutting the interior sidewall 48 of the aircraft.

In one instance, the foam bezel 20 is constructed by introduction of a foaming material into a mold cavity of a low pressure molding assembly. The molding process is initiated, and the foam bezel 20, which may include open cell or closed cell foam, is withdrawn from the mold. During the molding process, in one embodiment, as shown in FIG. 2, the electrically conductive insert 32 is provided in the form of a conductive foam layer 60. The electrically conductive insert 32 separates an interior portion 61A of the foam bezel 20 from an exterior portion 61B. The electrically conductive insert 32 may include any of a variety of widths. In the illustrated embodiment, the electrically conductive insert 32 has a width slightly larger than the width of the electrochromic element 30 and wraps around a portion of the electrochromic element 30 at the edge of the electrochromic element 30. Further, it is contemplated that the electrochromic element 30 may protrude into the foam bezel 20 only a small distance or may extend to the outer wall 26. The distance that the electrochromic element 30 extends into the foam bezel 20 will depend on the desired functionality and the desired tolerance and spacing between the inner surface 14 of the exterior pressure pane frame 12 and the electrochromic element 30. The conductive foam layer 60 is disposed between first and second portions 62, 64 of the foam bezel 20. It is generally contemplated that the first portion 62 of the conductive foam layer 60 will be constructed of a material that is similar or identical to the second portion 64 of the conductive foam layer 60. However, the first portion 62 and the second portion 64 may be constructed of different materials. For example, the first portion 62 may include a more thermally insulating material and the second portion 64 may include a more opaque material that prevents light infiltration into the cabin interior.

With reference again to FIG. 2, the conductive foam layer 60 is configured to define a portion of the channel 28 in which the electrochromic element 30 is positioned. The conductive foam layer 60 extends from the inner wall 24 of the foam bezel 20 to the outer wall 26 of the foam bezel 20. In addition, the conductive foam layer 60 includes light-absorbing characteristics, such that infiltration of light through the pressure pane 18 and around the channel 28 is greatly diminished or even eliminated. Consequently, upon activation of the electrochromic element 30, the window generally appears to darken. More specifically, electricity is applied to an electrochromic medium disposed between two pieces of glass of the electrochromic element 30 that are at least partially coated with an electrically conductive coating. When the electricity is applied to the electrochromic medium, the electrochromic medium begins to darken. The electrochromic element 30 may be similar to or the same as that disclosed in U.S. Patent Application Publication No. 2013/0161971, which is assigned to Gentex Corporation, the disclosure of which is hereby incorporated herein by reference in its entirety.

Figure 3:
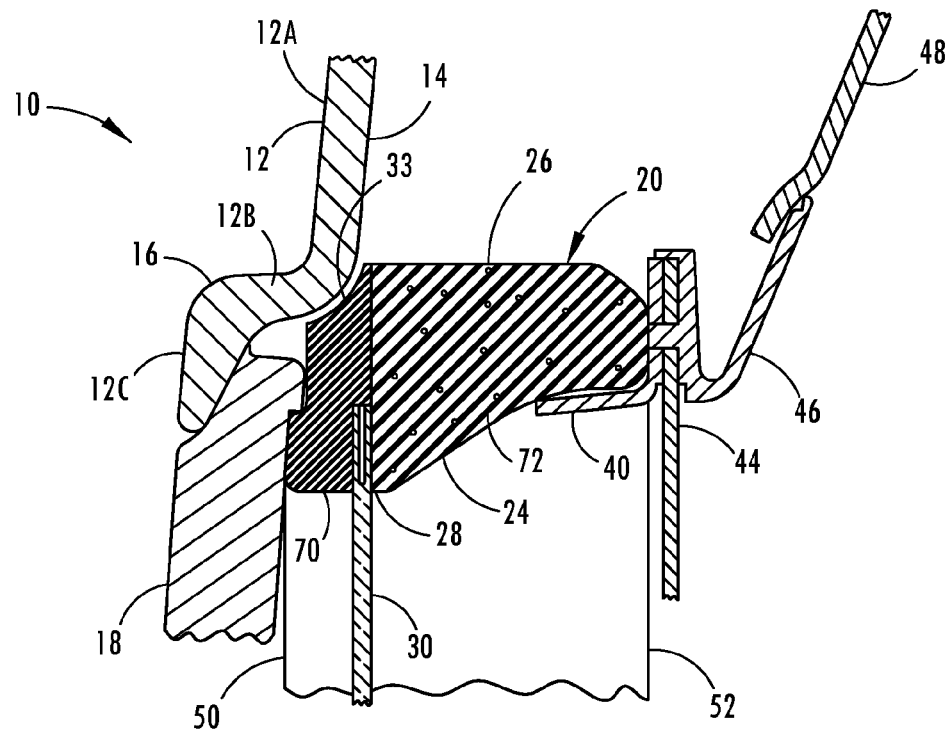
FIG. 3 is an enlarged top cross-sectional view of yet another embodiment of an aircraft window foam mounting assembly of the present invention.

In another embodiment of the aircraft window foam mounting assembly 10, as set forth in FIG. 3, the foam bezel 20 includes an electrically conductive member defined by a two-shot injection-molded foam having an external portion 70 that is conductive to electricity and an internal portion 72 that is not conductive to electricity. The conductive external portion 70 may be formed from a foam material that is similar to or the same as the foam material that forms the non-conductive internal portion 72. However, the external portion 70 will also include conductive properties resulting from the addition of a conductive material applied to the foam prior to the molding process. The conductive external portion 70 extends from the outer wall 26 to the inner wall 24 and also defines the entirety of the notch 33. In addition, the conductive external portion 70 abuts the pressure pane 18. However, the thickness of the conductive external portion 70 could differ from what is illustrated. The conductive external portion 70 is illustrated as having an interior surface that is coplanar with an inner surface of the electrochromic element 30. However, the interior surface of the conductive external portion 70 could be positioned closer to the dust cover 44, or could be adjusted slightly closer to the pressure pane 18. The channel 28 is defined between the conductive external portion 70 and the non-conductive internal portion 72 of the foam bezel 20. For this embodiment and the following embodiments, it will be understood that certain features of the embodiments may be present and represented with the same reference numeral.

Figure 4:
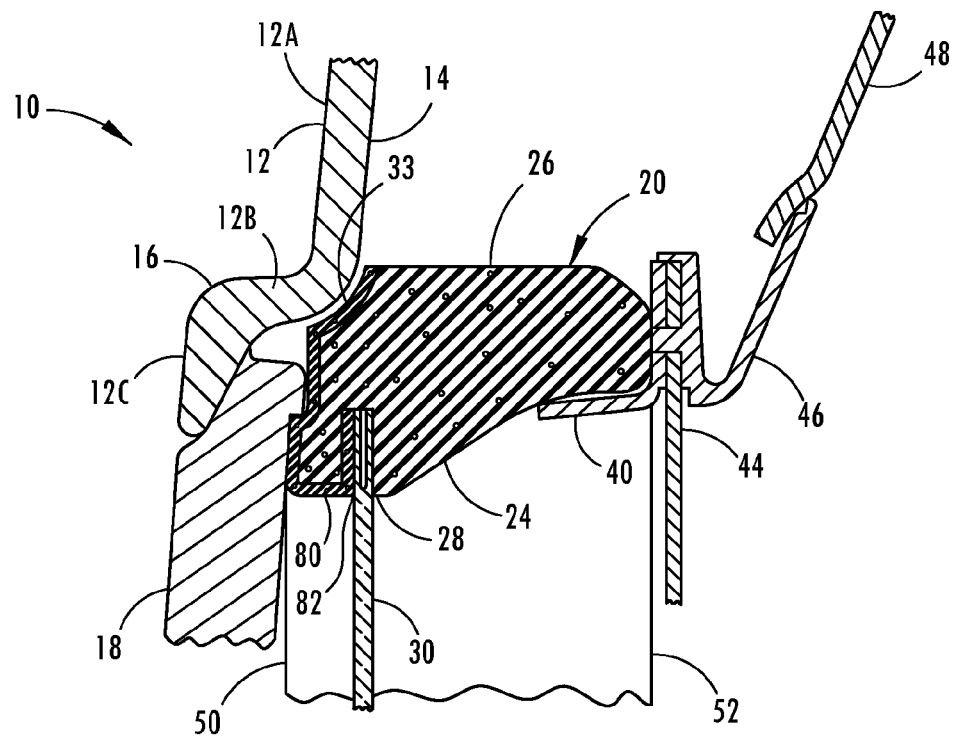
FIG. 4 is an enlarged top cross-sectional view of yet another embodiment of an aircraft window foam mounting assembly of the present invention.

With reference now to FIG. 4, in yet another embodiment, the foam bezel 20 includes an electrically conductive member defined by a conductive strip 80 made of rubber, or a similar polymeric material, that is molded into the foam bezel 20 during the molding process proximate the outer wall 26 of the foam bezel 20. In this instance, the conductive strip 80 extends along an outside portion 82 of the channel 28 and around the exterior wall 50 of the foam bezel 20 and terminates at the outer wall 26 of the foam bezel 20. The conductive strip 80 may include a multitude of strips of conductive material formed into the polymeric material and spaced a predetermined distance around the foam bezel 20. Alternatively, the conductive material may be very small particles interspersed into one flexible conductive strip 80 that would otherwise be non-conductive during construction of the conductive strip 80, prior to the molding process of the foam bezel 20. In the illustrated embodiment, the conductive strip 80 starts at the notch 33 and the outer wall 26 and wraps around the exterior wall 50 of the foam bezel 20. The conductive strip 80 also extends around a bottom portion of the foam bezel 20 outside the electrochromic element 30 and along an edge portion of the electrochromic element 30 where the electrochromic element 30 projects into the foam bezel 20.

Figure 5:
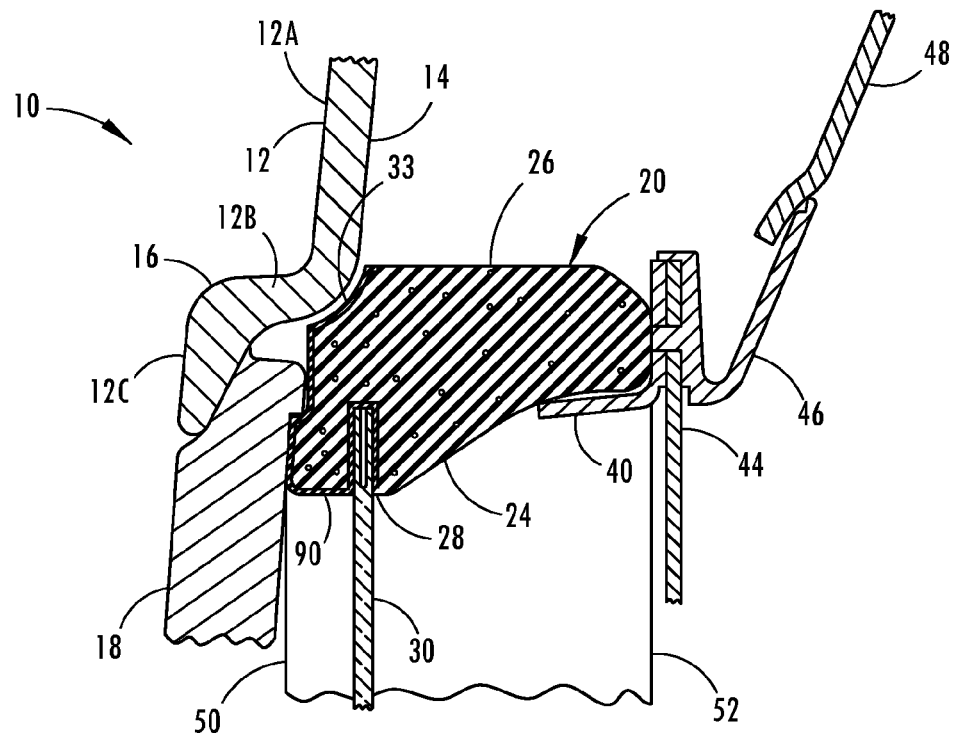
FIG. 5 is an enlarged top cross-sectional view of yet another embodiment of an aircraft window foam mounting assembly of the present invention.

With reference now to FIG. 5, in yet another embodiment, the foam bezel 20 includes an electrically conductive member defined by a thin sheet of conductive plastic or a thin conductive metal sheet 90 that is vacuum-formed around the channel 28 of the foam bezel 20 and also around the outer wall 26 of the foam bezel 20. In this instance, the thin conductive metal sheet 90 terminates at the outer wall 26 and also terminates inside the channel 28 short of reaching the inner wall 24 to increase the aesthetic appearance of a user gazing through or at the electrochromic element 30. It is also contemplated that the thin sheet could be constructed from a flexible metal mesh material. The flexible metal mesh could be secured to the foam bezel 20 during the molding process or after the molding process is complete. Notably, in the illustrated embodiment, the conductive metal sheet 90 follows a path similar to the conductive strip 80 depicted in FIG. 4. However, the conductive metal sheet 90 also wraps around the electrochromic element 30 and terminates inside the foam bezel 20 before reaching the inner wall 24.

Figure 6:
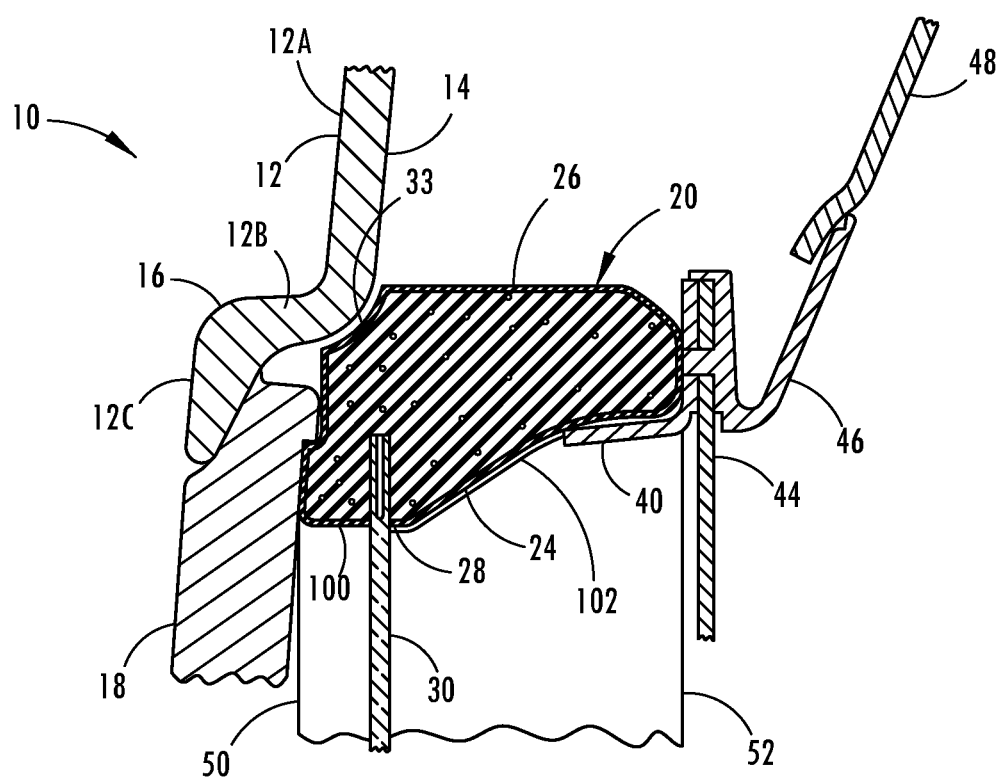
FIG. 6 is an enlarged top cross-sectional view of yet another embodiment of an aircraft window foam mounting assembly of the present invention.

With reference now to FIG. 6, in yet another embodiment, the foam bezel 20 includes an electrically conductive member having a fabric shielding gasket 100 is positioned about a periphery of the foam bezel 20. The fabric shielding gasket 100 is in the form of a sleeve of conductive material that extends around the foam bezel 20. The fabric shielding gasket 100 acts as an electromagnetic shield. An interior portion of the inner wall 24 of the foam bezel 20 may be covered with a paint or coating to provide an aesthetically pleasing appearance to the user. The fabric shielding gasket 100 generally acts as a sleeve that extends around the foam bezel 20. The fabric shielding gasket 100 could be positioned around the foam bezel 20 during the molding process or after the molding process is complete.

In still another embodiment, it is contemplated that the bezel may include a conductive material interspersed throughout the foam bezel 20. In this instance, the entire foam bezel 20 acts as an electromagnetic shield. The conductive material may include a multitude of particles evenly or unevenly distributed throughout the foam bezel 20. The conductive material may be added to the foam bezel 20 prior to molding.

The various embodiments of the dimmable window mounting assembly 10 as set forth herein are generally constructed to provide an electromagnetic shield between the exterior pressure pane frame 12 of the aircraft and the electrochromic element 30 disposed inside the foam bezel 20. The electromagnetic shielding also acts as a barrier that prevents light from passing through the foam bezel into an interior portion of the fuselage of the aircraft when the electrochromic element 30 is darkened. It will be understood that although the foam bezel 20 has been described as constructed from foam, it is also contemplated that he bezel may be formed from other materials and may be a polymeric bezel, metallic bezel, etc. The various embodiments disclosed herein provide an easy to manufacture and cost effective solution that can be implemented across a variety of foam bezel constructions as well as various aircraft types.

The present disclosure may be operably coupled with various electrochromic assemblies, such as that described in U.S. Pat. Nos. 8,201,800 and 8,210,695; U.S. Patent Application Publication Nos. 2014/0063630; 2012/0327234; 2013/0062497; and 2012/0218655; and U.S. Provisional Patent Application Nos. 61/709,716; 61/707,676; and 61/704,869, which are hereby incorporated herein by reference in their entirety.

It will be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. An aircraft window foam mounting assembly comprising:
   an exterior pressure pane frame including an inner surface and an outer surface;
   a pressure pane in abutting contact with the inner surface of the exterior pressure pane frame;
   a foam bezel proximate a periphery of the pressure pane and defining an inner opening, the foam bezel including an inner wall and an outer wall, wherein the inner wall includes a channel;
   an electrochromic element disposed in the opening and configured for reception in the channel of the inner wall; and
   an electrically conductive member operably coupled to the foam bezel and extending from the inner wall to the outer wall.

2. The aircraft window foam mounting assembly of claim 1, wherein the electrically conductive member extends through the foam bezel.

3. The aircraft window foam mounting assembly of claim 1, wherein the electrically conductive member wraps around the foam bezel.

4. The aircraft window foam mounting assembly of claim 1, wherein the electrically conductive member abuts the pressure pane.

5. The aircraft window foam mounting assembly of claim 1, wherein the electrically conductive member is at least partially covered by a coating.

6. The aircraft window foam mounting assembly of claim 1, wherein a portion of the electrically conductive member wraps around a portion of the electrochromic element.

7. A window mounting assembly comprising:
   a bezel defining an inner opening and including an inner wall and an outer wall, wherein the inner wall includes a channel;
   an electrochromic element disposed in the opening and configured for reception in the channel of the inner wall; and
   an electrically conductive member operably coupled to the bezel and extending from the inner wall to the outer wall.

8. The window mounting assembly of claim 7, wherein the electrically conductive member extends through the bezel and separates a first portion of the bezel from a second portion of the bezel.

9. The window mounting assembly of claim 7, wherein a portion of the electrically conductive member wraps around an edge of the electrochromic element.

10. The window mounting assembly of claim 7, wherein the electrically conductive member includes a multitude of particles interspersed throughout the bezel.

11. The window mounting assembly of claim 7, wherein the electrically conductive member is at least partially formed from a flexible metal mesh.

12. The window mounting assembly of claim 7, wherein the electrically conductive member is at least partially formed from a thin metal sheet.

13. The window mounting assembly of claim 7, wherein the electrically conductive member is disposed on only one side of the electrochromic element.

14. A method for making an aircraft window foam mounting assembly comprising:
   forming an exterior pressure pane frame including an inner surface and an outer surface;
   abutting a pressure pane with the inner surface of the exterior pressure pane frame;
   positioning a foam bezel proximate a periphery of the pressure pane, the foam bezel defining an inner opening and including an inner wall and an outer wall, wherein the inner wall includes a channel;
   inserting an electrochromic element into the channel of the inner wall; and
   coupling an electrically conductive member to the foam bezel that extends from the inner wall to the outer wall.

15. The method of claim 14, further comprising:
   wrapping a portion of the electrically conductive member around a portion of the electrochromic element.

16. The method of claim 14, further comprising:
   dispersing a multitude of particles throughout the bezel to form the electrically conductive member.

17. The method of claim 14, further comprising:
   wrapping the bezel with a sleeve of conductive material to form the electrically conductive member.

18. An aircraft window foam mounting assembly comprising:
   an exterior pressure pane frame including an inner surface and an outer surface;
   a pressure pane in abutting contact with the inner surface of the exterior pressure pane frame;
   a bezel proximate a periphery of the pressure pane and defining an inner opening, the bezel including an inner wall and an outer wall, wherein the inner wall includes a channel;
   an electrochromic element disposed in the opening and configured for reception in the channel of the inner wall; and
   a light limiting insert operably coupled to the bezel and extending from the inner wall to the outer wall, wherein the light limiting insert substantially decreases light infiltration through the bezel.

19. The aircraft window foam mounting assembly of claim 18, wherein an electrically conductive member wraps around a portion of the electrochromic element.

20. The aircraft window foam mounting assembly of claim 18, wherein an electrically conductive member extends through the bezel and separates a first portion of the bezel from a second portion of the bezel.

* * * * *